United States Patent [19]

Lebailly

[11] 4,275,403
[45] Jun. 23, 1981

[54] ELECTRO-LUMINESCENT SEMICONDUCTOR DEVICE

[75] Inventor: Jacques Lebailly, Caen, France

[73] Assignee: U.S. Philips Corporation, New York, N.Y.

[21] Appl. No.: 854,778

[22] Filed: Nov. 25, 1977

Related U.S. Application Data

[63] Continuation of Ser. No. 535,104, Dec. 20, 1974, abandoned, which is a continuation of Ser. No. 285,659, Sep. 1, 1972, abandoned, which is a continuation of Ser. No. 112,624, Feb. 14, 1971, abandoned.

[30] Foreign Application Priority Data

Feb. 6, 1970 [FR] France ............................ 70.04254
Feb. 6, 1970 [FR] France ............................ 70.04255

[51] Int. Cl.³ .................................................. H01L 33/00
[52] U.S. Cl. ........................................ 357/17; 357/48; 357/49

[58] Field of Search ........................ 357/17, 48, 49

[56] References Cited

U.S. PATENT DOCUMENTS

| 3,260,902 | 7/1966 | Porter | 317/235 |
|---|---|---|---|
| 3,293,513 | 12/1966 | Beaid | 317/235 |
| 3,499,158 | 3/1970 | Lavine | 250/217 |
| 3,500,139 | 3/1970 | Frouin | 317/235 |

Primary Examiner—Martin H. Edlow
Attorney, Agent, or Firm—Thomas A. Briody; Robert T. Mayer; Paul R. Miller

[57] ABSTRACT

An electro-luminescent semiconductor device having a plurality of electro-luminescent integrated diodes is provided in the present invention to be individually optically isolated from one another. By this construction data display and optical coding can be established in a device in accordance with the present invention.

22 Claims, 13 Drawing Figures

ELECTRO-LUMINESCENT SEMICONDUCTOR DEVICE

This is a continuation of application Ser. No. 535,104, filed Dec. 20, 1974 which is a continuation of Ser. No. 285,659, Sept. 1, 1972 now abandoned; which is a continuation of Ser. No. 112,624, Feb. 14, 1971, now abandoned.

This invention relates to a semiconductor device comprising at least two electro-luminescent elements provided with connecting conductors so that each element can be excited separately, said elements being located at least one semiconductor layer on a substrate.

Electro-luminescent semiconductor elements emitting photons by recombination under the action of an applied voltage or by current injection are frequently used in groups forming matrices of dots, dashes or different patterns, for example, for displaying α-numerical symbols or for the formation of optical coding pannels with X-Y co-ordinates.

These uses commonly require visible emission and a fairly high radiation output. Among the known materials employed for their electro-luminescent properties are semiconductor materials having an indirect band structure, in which the radiation recombinations occur via activation levels located in the forbidden band. Despite a low internal quantum output these materials are interesting because they have a very low absorption coefficient for the radiation emitted by them, so that the resulting external light output may be higher than that of materials having a higher internal quantum output, but strongly absorbing their own radiation.

The display of character patterns by combinations of dot and dash elements requires the location of the emitted light at the area of the desired elements and often the possibility of electrical insulation of each of these elements. A suitable location is rendered difficult in the semiconductor materials having an indirect band structure which are permeable to their own radiation if they are not strongly doped.

In the known electro-luminescent mosaics, this location and insulation can be achieved only by joining separate elements such as diodes and by locating them in an impermeable and preferably insulating material. The resultant matrices are not monolithic because the crystals forming the diodes are separated from each other and are only immovable, relative to each other by being fastened to the support or by their connections. The manufacture of the mosaic comprises a large number of difficult operations and the extent of miniaturisation is restricted by the nature of the support and the connections. The insulation between these diodes only consists of air or of an insulating material provided between the diodes and the relative distances are subject to a minimum limit. Since the assembly is not monolithic, the stability, accuracy and stiffness are not sufficient for coupling with, for example, a bundle of optical fibres.

On the other hand, integrated radiation mosaics provided on a common, monolithic support by known so-called planar or MESA techniques require the use of materials known to absorb their own radiation, since otherwise the localisation of the emission involves complicated precautions. It is known, for example, to restrict the bias voltage producing the radiation emission of a pn-junction to a portion of this junction by controlling a current passing along the portion parallel to the junction. This method inhibits the emission effectively, but since it may be omnidirectional, the localisation is not sufficient.

The present invention has for its object to obviate this drawback and to enable the manufacture of electro-luminescent mosaics of elements integrated in a semiconductor body, particularly with semiconductor material transparent to the emitted radiation, for example, semiconductor materials having an indirect band structure. By using conventional methods for the manufacture of integrated circuits, a high density of elements and an optimum utilisation of space can be achieved with a reliability comparable with that of the conventional semiconductor devices.

According to the invention a semiconductor device of the kind set forth is characterized in that the elements are separated from each other by optically isolating zones extending from the layer surface across the whole thickness of the layer and being substantially impermeable to the radiation emitted by the elements.

The term "impermeable" in this specification is to be understood to mean the property of a region having such an absorptive power that any radiation passing through is negligible, at least for the use concerned; in other words, the thickness of the absorbing material is at least equal to three times the absorption length, the latter being defined as being the distance over which the intensity of the incident radiation decreases by a factor $1/e$.

The optically isolating zones and the support of the device embodying the invention form an island of the kind used in integrated circuits for the electrical insulation of active or passive elements of these circuits. Because at least the sidewalls of the island thus formed are impermeable to the radiation emitted by the luminescent element contained therein, the radiation emission is, in fact, localized, even if the material enclosed in the island is permeable to the emitted radiation. The monolithic assembly comprising a plurality of islands provides many of the advantages of integrated circuits particularly with respect to miniaturisation, homogeneity of quality and reliability.

One or more of the optically isolating zones may be also electrically insulating. The isolating zones may be made by methods usually employed for the manufacture of integrated circuits.

The substrate is preferably made of a material which strongly absorbs the emitted radiation. It is advantageous to provide on the bottom side of the island an impermeable isolating region so that the radiation is absorbed in the substrate before penetrating deeply into it.

When the substrate is made of an insulating material that can absorb the emitted radiation, with a consequent reduction in resistivity, for example, semi-insulating material, whose forbidden band width is lower than the energy of the emitted photons, (for example, gallium arsenide compensated by chromium), the width of the isolating regions parallel to and at the level of the interface between the semiconductor layer and the substrate is preferably greater than six times the absorption length of the emitted radiation in the substrate. In order to ensure the isolation between the elements, a substantially non-ionized substrate region of adequate width is provided.

When the substrate is made of a semi-insulating, that is semiconductor, material in which the diffusion length of the free charge carriers is great, the optical between isolation may be sufficient if the width of the isolating regions is smaller than the diffusion length. In this case, it is advantageous to provide such a great width of these zones viewed parallel to and at the level of the interface between the substrate and the layer in which the elements are formed, that the diffusion of the free charge carriers does not give rise to an undesirable current. For example, a width at least equal to three times the diffusion length is satisfactory.

Particularly, when the width of the isolating regions cannot be sufficient, it is advantageous to provide an absorbing intermediate layer between the substrate and the layer containing the electro-luminescent elements.

In a preferred method embodying the invention, the isolating zones are made by selective diffusion of a dopant in a semiconductor epitaxial layer deposited on a substrate, the impurity inducing a conductivity type opposite that of the layer, the dopant concentration being high. This high dopant concentration provides a high absorptive power of these zones for radiation emitted from the same material in a region of preferably lower dopant concentration, for example, from a pn-junction in the material. The junction between the epitaxial layer and the zones may be biased in the reverse direction and then forms an effective electrical insulation as in a known method of manufacturing integrated circuits. The manufacture of the isolating zones does not require an additional process as compared with the method of manufacturing monolithic, integrated circuits.

A single impermeable zone may be found to be insufficiently electrically insulating if the resultant junction exposed to the radiation is likely to produce a given leakage current. In this case, the diffused isolating zones identical to the former zones are provided at a small distance from the latter and at the side thereof. The diffusion of the zones operating as absorption zones and the zones identical in depth and concentration and operating as isolating zones is carried out in one operation.

If two electro-luminescent elements have to be separated optically and connected electrically by at least one of their electrodes, the zones which have to be impermeable and conductive are formed by the diffusion to a high dopant concentration of the conductivity type of the epitaxial layer. In another method, the isolating zones are made by forming grooves in the epitaxial layer to a depth such that the substrate is attained, the grooves being filled with an electrically insulating material, which is impermeable to the emitted radiation; as an alternative the grooves are coated with an insulating material and filled with impermeable material, which need not be insulating, if desired.

The electro-luminescent elements of the device embodying the invention may be diodes having a pn-junction or other structures having normal junction or heterojunctions of the pn- or pin-type with tunnel effect or avalanche effect.

In an advantageous embodiment, the electro-luminescent elements are diodes having flat pn-junctions obtained either by diffusion of a zone of a first conductivity type in an epitaxial layer of the opposite conductivity type, either by diffusion of a zone of a first conductivity type in a zone of the opposite conductivity type, the zone itself being diffused in an epitaxial layer of the first conductivity type or by the deposition of two consecutive epitaxial layers of opposite conductivity types.

The shape, the number, the relative positions and the dimensions of the elements depend upon the use contemplated and without any particular limitation the conventional masking and photo-resist techniques employed for the manufacture of integrated circuits may be used.

A particular aspect of the invention relates to the so-called X-Y matrices comprising electro-luminescent elements arrayed in columns and rows and electrically connected to each other, the selective excitation of an element being obtained by the application of a voltage or a current between the relevant column and row. For this purpose, the elements may be formed by diodes locally diffused in portions of the epitaxial layer, which is deposited on an insulating substrate impermeable to the emitted radiation, the elements of the same row being separated by the diffused zones which are not permeable to the emitted radiation but preferably have a very low resistivity, the rows being separated by diffused zones which are not permeable to the emitted radiation and are electrically insulating as well. The diffused regions of the elements of the same column are in this case connected by a common connection. As a matter of course, the columns and rows may be inverted. The substrate of such a matrix comprises an insulating or semi-insulating material which absorbs the radiation emitted by the elements and the width of said electrically insulating zones between two elements is such that the insulative power of the substrate portions located beneath the zones is substantially not reduced despite a potential ionisation of the substrate material by the absorbed radiation.

The diodes of such an X-Y matrix may also have pn-junctions formed by two epitaxial layers of opposite conductivity types.

The method embodying the invention comprises only processes generally used for the manufacture of integrated circuits. If the absorbing zones are diffused from the surface, the method according to the invention does not add any further process to the conventional method of manufacturing, for example, bipolar integrated circuits.

The invention will now be described more fully with reference to the accompanying drawings.

It should be noted that the correct dimensions and proportions particularly in the direction of thickness are not true in the accompanying drawings for the sake of clarity.

Figure 1:
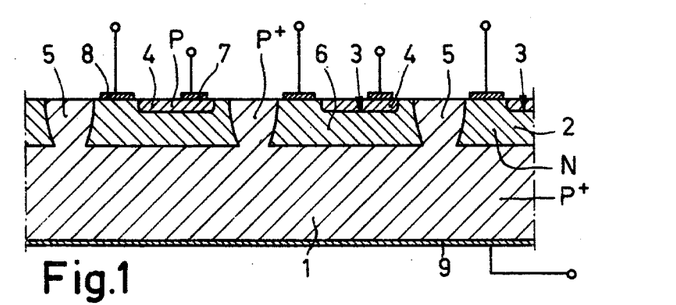
FIGS. 1, 2 and 3 are schematic, partial sectional views of devices embodying the invention in various forms.

The device shown in FIG. 1 is made in a single crystal wafer comprising a substrate 1, on which an epitaxial layer 2 of the opposite conductivity type is grown. A suitable material for the manufacture of this device may be gallium phosphide. The substrate 1 is strongly doped for p+-type conductivity, the layer 2 is weakly doped for n-type conductivity and the electro-luminescent elements are formed by the pn-junctions 3 between the layer 2 and the diffused p-type zones 4. The layer 2 is divided into islands 6, which are separated from each other by a network of diffused zones 5, which extend down to the substrate 1, each island comprising a zone 4 and a junction 3. The zones 5 are strongly doped for p+-type conductivity so that the walls and the bottom of each island are strongly doped and not permeable to the radiation emitted from the junctions 2. For the emission of radiation perceptible across the zones 4, the junctions 3 are biased in the forward direction, a voltage being applied between the electrodes 7 and 8 of the junctions concerned. In this example, the potential of the electrode 7 is positive relative to that of the electrode 8. The insulation between the islands is obtained by biasing in the reverse direction the junction between the epitaxial layer 2 on the one hand and the substrate 1 and the zones 5 on the other hand. A potential which is negative with respect to the electrode 8 is applied to the electrode 9 on the substrate 1.

As a matter of fact, the above-mentioned conductivity types are given by way of example and a corresponding device may be manufactured which has the opposite conductivity types.

The diffused zones 5 and the substrate 1 enclose islands so that the radiation emission is localised and at the same time each element is electrically insulated. The substrate 1 consists of gallium phosphide doped with zinc up to a concentration of $10^{19}$ at/cm$^3$, the layer 2 consists of gallium phosphide doped with tellurium up to a concentration of $5 \times 10^{17}$ at/cm$^3$, the epitaxial growth being preferably performed from the liquid phase, for example, from a gallium solution. The diffused zones 4 are doped with zinc to a concentration of $10^{18}$ at/cm$^3$ and the zones 5 are also doped with zinc to a concentration of $5 \times 10^{19}$ at/cm$^3$. The resultant radiation is red of a wavelength of about 6900 Å. This radiation is strongly absorbed in the zones 5 and in the substrate 1, where the absorption coefficient $\alpha$ for the radiation emitted by the junctions 3 is in the order of $10^2$ to $10^3$ cm$^{-1}$.

As a matter of course, the surface pattern of the junctions 3 may have any shape and any radiation pattern may have the shape of a circle, a square, a straight or curved line, each pattern being completely surrounded by a zone 5 in accordance with the desired localisation of the radiation, by electrical insulation.

Figure 2:
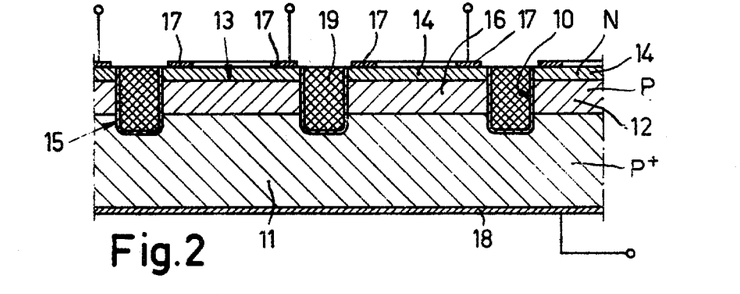

The device shown in FIG. 2 is made by starting from a substrate 11 of a material of low resistivity, which is not permeable to the radiation emitted by the luminescent elements of the device. These elements are formed by portions of the junction 13 between a first epitaxial layer 12 grown on the substrate 11 and a second epitaxial layer 14 grown on the first layer, the conductivity types of the two layers being opposite. The substrate 11 may be p-type, the layer 12 p-type and the layer 14 n-type conductive.

A network of grooves 15 is made in the wafer comprising the substrate 11 and the layers 12 and 14, the depth of the grooves being sufficiently great for reaching the substrate 11. This network defines an assembly of islands 16. The portions of the junctions 13 located in each of these islands are rendered luminescent by the application of a voltage in the forward direction between the electrode 17 of each island on the one hand and the electrode 18 on the other hand, the voltage being common to all junction portions. For screening purposes and for restricting the useful luminescent zones to the desired portion of the junction, the grooves 15 are filled with a substance 19 impermeable to the radiation, for example, an epoxy resin. If this impermeable substance is not electrically insulating, an insulating layer 10 is applied to the walls and the bottoms of the grooves 15 prior to filling with the impermeable substance 19. The insulating layer may be of silica.

Figure 3:
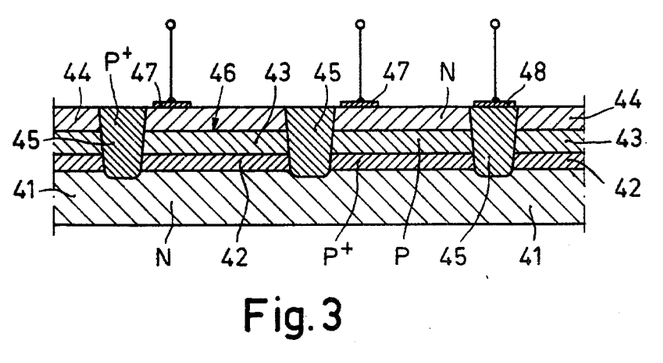

The device shown in FIG. 3 is obtained by starting from a substrate 41, a surface layer 42 of which is doped by diffusion so that its conductivity type is opposite that of the subjacent substrate while the dopant concentration is high. The substrate 41 may be n-type and the layer 42 may be p+-type conductive. On the substrate are grown in order of succession two epitaxial layers 43 and 44, the layer 43 being of the same conductivity type as the layer 42, the dopant concentration being, however, lower and the layer 44 being of the opposite conductivity type. In accordance with the invention, the zones 45 are diffused down to the subjacent layer of the substrate 41 with a high dopant concentration providing the same conductivity type as that of the layer 42.

The zones 45 bounding different regions in the layers 43 and 44 from separate diodes with respective junctions 46 between the regions in layers 43 and 44, which diodes can be rendered luminescent by biasing in the forward direction with the aid of the electrodes 47 which contacts each diode surface region and the electrode 48, which may be common to all diodes, since the zones 45 may also form a coherent network, in which the diodes form islands. These islands are electro-luminescent and the radiation emission is effectively localized, whereas the zones 45 like the layer 42 are impermeable to the emitted radiation.

A mosaic of the kind described above may be made in gallium phosphide, wherein the luminescent surface layer 44 of a thickness of 5 μm is doped with tellurium to a concentration of $10^{18}$ at/cm$^3$, the subjacent layer 43 of a thickness of 5 μm is doped with zinc to a concentration of $10^{17}$ to $10^{18}$ at/cm$^3$ and the layer 42 has a network of zones 45 localizing the luminescent regions and doped with zinc to a concentration of at least $10^{19}$ at/cm$^3$.

A variant of the method of manufacturing this matrix comprises the step of excavating the network of zones 45, instead of diffusion thereof, the cavities being filled with a polycrystalline or epitaxial deposition of gallium arsenide. This material has a width of the forbidden band smaller than the energy of the photons emitted by the gallium phosphide. The zones 45 are impermeable and localize effectively the radiation emission.

Figure 4:
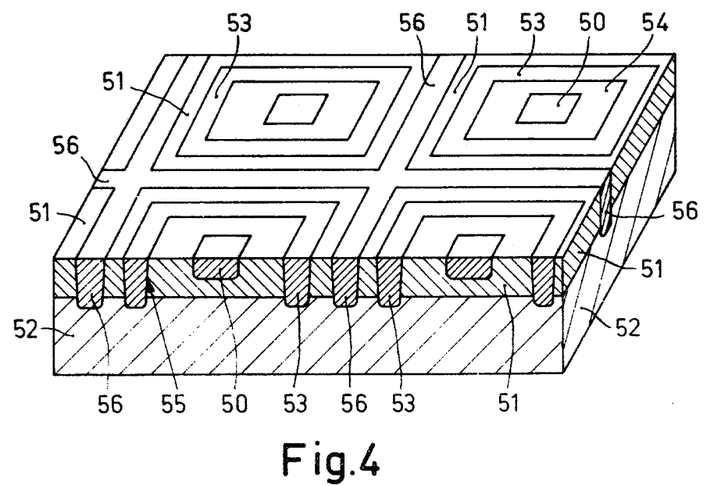
FIG. 4 is a schematic, perspective view of part of the device embodying the invention in a different form.

The device shown in FIG. 4 is a mosaic of electro-luminescent diodes obtained by local diffusion of regions 50 in an epitaxial layer 51 of the opposite conductivity type deposited on an electrically insulating substrate 52, which is impermeable to the radiation emitted upon the application of a voltage in the forward direction to the pn-junctions between the regions 50 and the layers 51.

Diffused zones 53 on the layer 52 form the boundaries of the regions 54 in which the radiation emission has to be localized. These zones 53 are of the conductivity type opposite that of the layer 51 and the junction 55 between these zones and the layer 51 can be biased in the reverse direction and serves for insulating the regions 54. However, this insulating junction is exposed to radiation and under given conditions this may give rise to an undesirable current. Zones 56 identical to the zones 53 and diffused simultaneously therewith double these zones 53 and since they are not struck by the radiation which is adequately absorbed by the zones 53, they can be biased in the reverse direction for the electrical insulation between the diodes.

Figure 5:
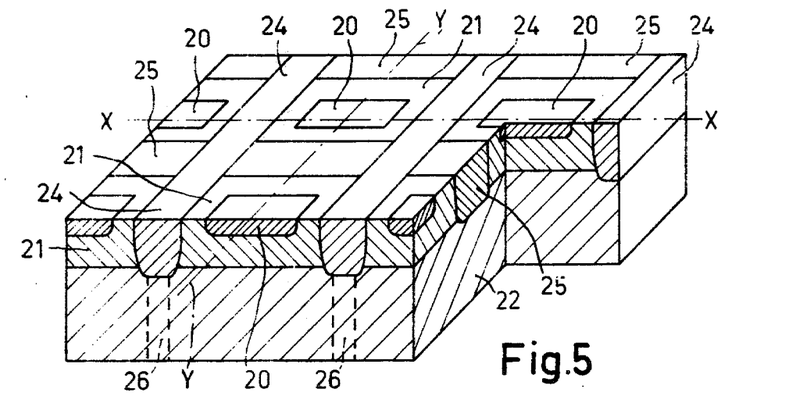
FIG. 5 is a perspective view of part of the device embodying the invention, formed by an X-Y-matrix.

The device shown partly in FIG. 5 is a mosaic of electroluminescent diodes of the X-Y type. The diodes arranged on straight lines in two orthogonal directions (XX and YY in FIG. 5) are formed by the local diffusion of regions 20 in an epitaxial layer 21 of the opposite conductivity type deposited on an electrically insulating substrate 22, which is impermeable to radiation emitted upon the application of a voltage in the forward direction across the junctions between the regions 20 and the layer 21. The substrate 22 is selected to be a material to maintain its insulating properties even when the diodes are emitting and their radiation passes without any appreciable absorption through the epitaxial layer to reach substrate 2. The diodes of the same row YY are isolated from the diodes of an adjacent row with the aid of the zones 24, diffused down to the substrate and absorbing the radiation emitted by the diode and having a conductivity type opposite that of the layer 21 so that their junction cannot become conducting upon biasing in the reverse direction.

If the substrate is likely to be ionized by the absorption of this radiation, it is necessary to provide for the diffused zones 24 isolating the diodes of the same row YY from the diodes of adjacent rows such a width that at least a region 26 of the subjacent substrate is not ionized.

If the width of the zones 24 cannot be sufficiently large, an intermediate layer may be provided for maintaining the insulation, between the layer 21 and the substrate 22, the intermediate layer absorbing the radiation before it reaches the substrate 22. Such an intermediate layer, forms a screen and thus enables to use a semi-insulating material for the substrate, irrespective of the dimensions of the zones 24.

A few examples will be described hereinafter with reference to the FIGS. 8 to 13.

The diodes of the same row YY are isolated from each other by means of diffused zones 25, which absorb the radiation emitted by the diodes, but which can be doped with a high dopant concentration in order to have either the same conductivity type as the layers 21 and 23 or the opposite conductivity type.

The connections not shown in FIG. 5 are established by means of the so-called multi-layer technique which is frequently employed for the manufacture of integrated circuits so that the desired reverse voltage can be applied to the isolating junctions and the desired excitation voltages to the row of zones 21 and to the column of zones 20, which correspond to the diodes to be excited.

A matrix of the kind set forth is made on a substrate 22 of semi-insulating gallium arsenide doped with chromium and having a higher resistivity than $10^6$ Ohm.cm at room temperature. An epitaxial layer of gallium phosphide doped with tellurium is deposited and the electro-luminescent junctions are obtained by local diffusion of zinc. The impermeable isolating zones 24 are doped by diffusion with zinc to a concentration of more than $10^{19}$ at/cm$^3$ and the zones 25 are doped by diffusion with tin to a concentration of more than $10^{19}$ at/cm$^3$. The substrate 22 has in this case an absorption coefficient $\alpha$ of the order of $5\times 10^4$ cm$^{-1}$. Since the isolating zones 24 usually have a width exceeding 10 $\mu$m, for example, of the order of a few hundred microns the portions 26 of the substrate 22 located beneath the zones maintain their insulating power for the major part. However, it is necessary to assess that the width of the isolating zones at the level of the substrate is larger than the diffusion length of the free charge carriers in the material of the substrate 22, say at least three diffusion lengths.

The device embodying the invention, which permits of restricting the visible or non-visible electro-luminescence from a completely integrated element of any composition to an accurately defined surface, is particularly suitable for the manufacture of matrices for the display of characters or symbols by the combination of dots and dashes or different patterns. The device embodying the invention is preferably manufactured in a single crystal wafer of semiconductor material having an indirect band structure, particularly gallium phosphide or gallium arsenide phosphide having a phosphide content exceeding 40% or in an epitaxial layer of this compound on a substrate of gallium arsenide.

Figure 6:
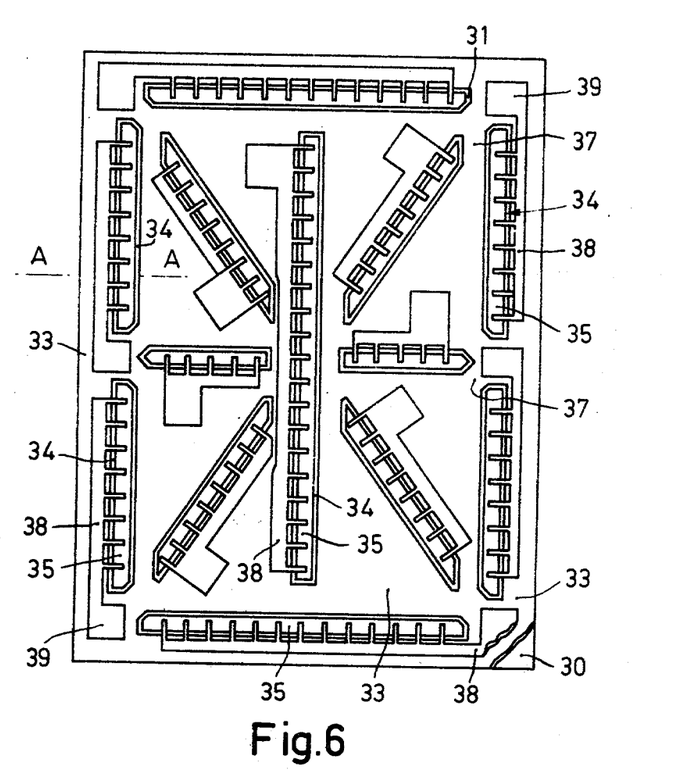
FIG. 6 is a plan view of the device formed by a mosaic having 13 strip-shaped zones for the display of characters.
Figure 7:
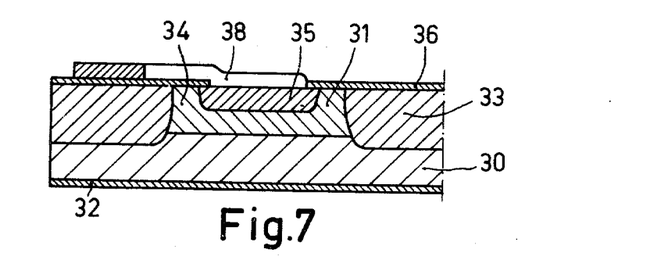
FIG. 7 is a partial sectional view taken on the line A—A of the device shown in FIG. 6.

An example of a matrix for the display of numerical symbols according to the invention is shown in the plan view of FIG. 6 and in the partial sectional view of FIG. 7.

This matrix is of a known type and comprises 13 luminescent faces, which can be selectively excited and are formed by strips arranged on a rectangle with diagonals and lines of gravity. These faces are formed by pn-junctions obtained by local diffusion in a single crystal wafer.

A semiconductor wafer 30 is covered by epitaxial growth with a semiconductor layer 31. A region 33 is diffused in layer 31 to a depth sufficient to reach into the substrate 30, the whole wafer being covered with the exception of the strip-shaped zones 34, inside which a strip-shaped region 35 is diffused, the conductivity type thereof being opposite that of the layer 31. The region 33 surrounding each of the strips 34 comprises the strips 35 and forms a screen which restricts luminescence to the regions 34. The region 33 has the same conductivity type as the strips 35, but it is very strongly doped in order to absorb the radiation emitted by the pn-junctions between the regions 34 and 35. Spacing 37 between two adjacent strips 34 is provided so that adequate impermeability is maintained between these strips 34.

The excitation electrodes of the pn-junctions are formed on the one hand by a common electrode, for example, a metal layer 32, on the substrate 30 of the same conductivity type as the layer 31 but having a high dopant concentration and on the other hand by comb-shaped electrodes 38 so that a uniform distribution of the excitation is ensured throughout each strip 35. The electrodes are deposited by metallisation in vacuo on a permeable, insulating layer 35, which covers the wafer with the exception of the regions 35. The combs 38 comprise each a face 39 to which a wire connection can be soldered.

When a voltage is applied between one of the electrodes 38 and the substrate 30, the corresponding junction between the relevant region 34 and the corresponding region 35 becomes luminescent. The emitted radiation penetrates at least into the region 35, but it is inhibited by the diffused zone 33 to the regions 34 and 35 concerned. A character is displayed by exciting the various strips forming the character. The localisation of the luminescent parts ensures correct reading, even of characters of very small size, for example, written in a rectangle of $3 \times 5$ mm$^2$.

Figure 8:
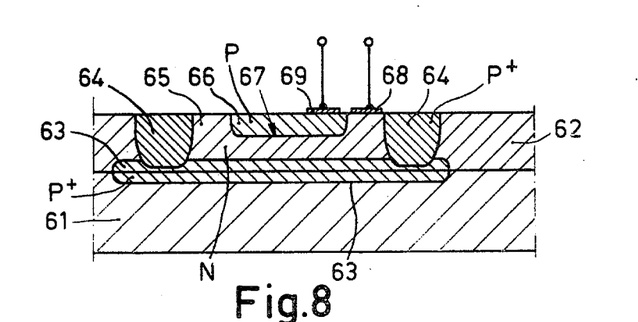
FIG. 8 is a partial, schematic sectional view of a device embodying the invention in a different form.

FIG. 8 shows a further embodiment of the device in accordance with the invention. The device shown in FIG. 8 is made in a single crystal wafer having a substrate 61, on which an epitaxial layer 62 with indirect band structure is deposited. A localized buried layer 63 made by the known techniques by local diffusion prior to the deposition of the layer 62, is provided between the layer 62 and the substrate 61. The buried layer 63 has a conductivity type opposite that of the layer 62 and a high dopant concentration. A diffused layer 64 of the conductivity type opposite that of the layer 32 having a high dopant concentration penetrates into the layer 62 at least to an extent such that the layer 63 is attained, so that with this layer 63 an island is formed which defines a portion 65 of the epitaxial layer 62. In this portion 65 a region 66 is diffused, the conductivity type of which is opposite that of the layer 63, the region 66 and the portion 65 forming a substantially flat pn-junction 67, the resultant diode forming an element of the device. Contacts 68 and 69 are provided on the regions 65 and 66. The junction 67 becomes luminescent when it is biased, the emitted radiation penetrating into the region 65, which does not absorb this radiation. The zone 64, which is highly doped, localizes the emergence of this radiation at the surface surrounding the zone. The layer 63 furthermore prevents the radiation from striking the substrate 61. By biasing in the reverse direction of the junction between on the one hand the region 65 and on the other hand the layer 63 and the zone 64 the insulation of the luminescent elements relative to the remaining part of the device is ensured, which device may comprise any number of elements of the same structure. As a matter of course, if the various local layers such as the layer 63 associated with different elements are close to each other, these layers 63 may be replaced by one common layer or by a layer deposited by epitaxial growth on a large face of the substrate 61.

The layer 63 may be of gallium phosphide or gallium arsenide phosphide and is deposited on a substrate of gallium arsenide. The dopants of the various regions or zones may be tellurium in the n-type region 65 (concentration $5 \times 10^{17}$ at/cm$^3$), of zinc in the p-type zone 64 and the p-type layer 63 (concentration $10^{19}$ at/cm$^3$), of zinc in the p-type region 66 (concentration $10^{19}$at/cm$^3$), of zinc in the p-type region 66 (concentration $10^{18}$ at/cm$^3$). Under these conditions the emitted radiation is strongly absorbed in the zone 64 and the layer 63, where the absorption coefficient for this radiation is of the order of $10^{13}$ cm$^{-1}$.

Figure 9:
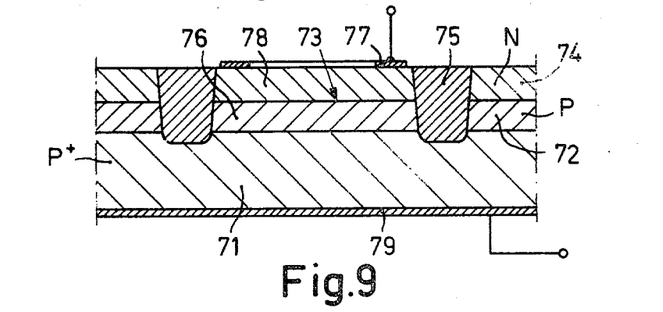
FIGS. 9, 10 and 11 are schematic, partial sectional views of further embodiments of the device in accordance with the invention.

The device shown in FIG. 9 is obtained on a substrate 71, made of a material having a low resistivity. The luminescent elements are formed by portions of the pn-junctions 73 between a first epitaxial layer 72 grown on the substrate 71 and a second epitaxial layer 74 grown on the first layer, the conductivity types of the two layers being opposite one another; for example, substrate 71 is p$^+$-type, the layer 72 is p-type and the laye 74 is n-type conductive. The layer 72 absorbs the radiation emitted by the junctions 73 formed by the superimposition of one layer on the other.

A network of grooves 75 is provided in the wafer formed by the substrate 71 and the layers 72 and 74, the depth sufficient to reach the substrate 71. This network defines an array of islands 76 and 78 in the layers 72 and 74. The portions of the junction 73 located in each of these islands become luminescent by the application of a voltage in the forward direction between the electrodes 77 associated with each island on the one hand and 79 on the other hand, the latter being common to all portions of the junction. In order to form a screen and to restrict the radiating zones to the desired islands, the grooves 75 are filled with a material impermeable to the emitted radiation, for example, an epoxyresin. If this impermeable material is not electrically insulating, an insulating layer is applied to the walls of the grooves 75 before the grooves are filled with the impermeable material.

Figure 10:
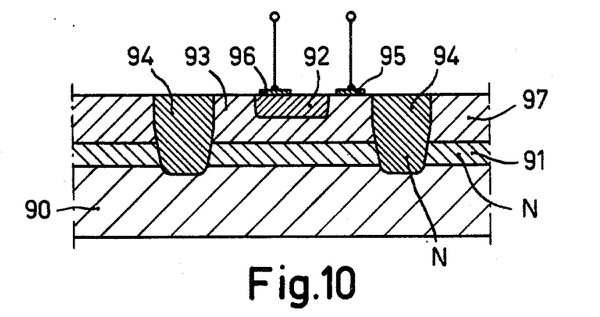

The device shown in FIG. 10 comprises electroluminescent elements formed by diffused diodes, the junctions of which lying between a diffused region 92 and an epitaxial region 93 is biased in the forward direction via the contacts 95 and 96 of each of the diodes. The epitaxial layer 97 including the region 93 is deposited on a layer 91, which is deposited on a support 90. The layer 91 serves as an absorbing layer. The impermeable zones 94, each surrounding a diode, extend from the surface of the device down to the substrate 90.

In one embodiment of the invention the impermeable zones 94 are made of a different semiconductor material than the layer 97 and the layer 91 is made of a material differing from that of the substrate 90; the zones 94 and the layer 91 are provided in a semiconductor layer having a width of the forbidden band lower than the energy of the photons emitted by the diode. The substrate 90 and the layer 97 are preferably made of gallium phosphide, the zones 94 are formed by grooves filled out with a polycrystalline gallium arsenide deposit and the layer 91 is obtained by epitaxial growth of gallium arsenide on the substrate 90.

In a variant of a device embodying the invention, in which the support is made of a semi-insulating material in which the diffusion length of the free charge carriers is very great, the layer 91 is formed by a layer of the same material, having however a thickness and a dopant concentration such that, like the zones 94, it is impermeable to the radiation emitted by the diodes 92,93.

The substrate 90 may be of semi-insulating gallium arsenide, the zones 94 and the layer 91 of n-type gallium arsenide doped with tellurium to a concentration of about $10^{17}$ at/cm$^3$, the layer 97 being of gallium arsenide phosphide of the formula GaAs$_{1-x}$P$_x$, wherein x lies between 0 and 1.

Figure 11:
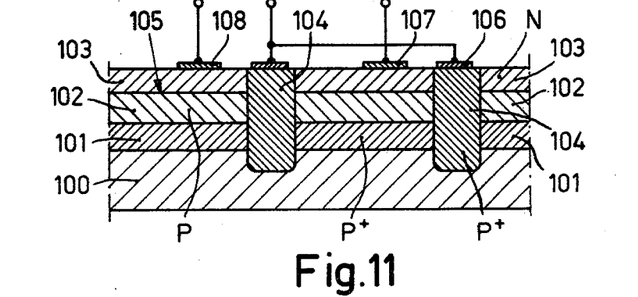

The device shown in FIG. 11 is made on a substrate 100 having a high resistivity. This substrate is subjected to a diffusion providing a p$^+$-type layer 101. A p-type layer 102 is epitaxially grown on the diffused layer 101 and a second n-type epitaxial layer 103 is grown on the layer 102. p$^+$-type insulating and impermeable zones 104 are provided by diffusion. The diodes formed by the portions of the junctions 105 located between the layers 102 and 103 can be caused to luminesce by the application of a voltage between the electrode 106, which is common to all diodes of the device, and the electrodes 107 and 108 each associated with a single diode.

When gallium phosphide is chosen for the manufacture of the device shown in FIG. 11, for example, owing to the wavelength of the desired radiation, the layers 101 and the zones 104 are doped with zinc to a concentration of $10^{19}$ at/cm$^3$ the layer 102 has a concentration of $5\times10^{17}$ zinc at/cm$^3$ and a thickness of about 5 μm, the layer 103 has a concentration of $10^{18}$ tellurium at/cm$^3$ and a thickness of about 5 μm.

Figure 12:
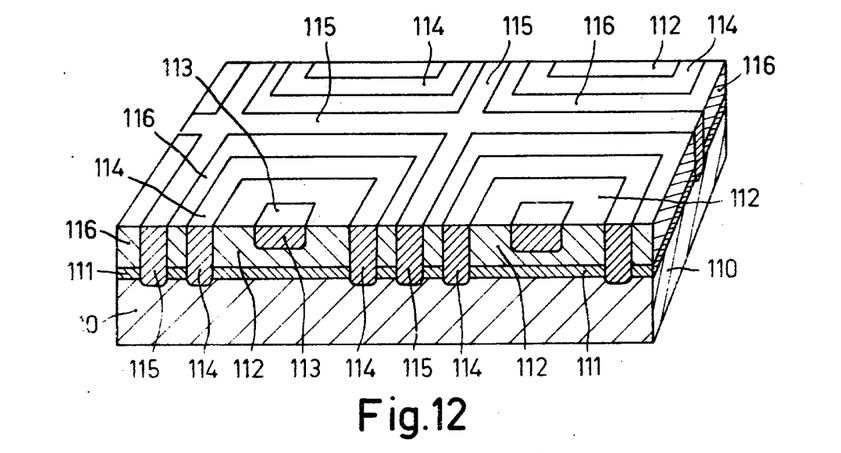
FIG. 12 is a perspective view and partial sectional view of a further embodiment of the device in accordance with the invention.

The device partly shown in FIG. 12 is a mosaic of electroluminescent diodes arrayed in columns and rows in two orthogonal directions. The diodes are formed by pn-junctions between the regions 113 diffused in an epitaxial layer 112 deposited on an absorbing layer 111, which is deposited on a substrate 110. The diodes are surrounded by diffused zones 114, which are impermeable to the emitted radiation and which are surrounded by diffused zones 115, which are insulating and impermeable to the emitted radiation.

The zones 114, 115 and 113 are of the same conductivity type, the zones 114 and 115 are identical and strongly doped and the layers 111 and 112 are of the same conductivity types opposite those of the zones 114 and 115, the zone 111 being strongly doped and the substrate 110 being semi-insulating.

It is found in this device that even if the absorbing zones 114 are ionized to an extent such as to allow a nonnegligible current to pass, even with biasing in the reverse direction, the insulation of the diodes 112, 113 is ensured by means of the zones 115, the junctions of which can be biased in the reverse direction, and which cannot be struck by the emitted radiation.

During the manufacture of the device shown in FIG. 12 the zones 114 and 115, whose depth and dopant concentrations are identical, are diffused simultaneously in a single operation.

Figure 13:
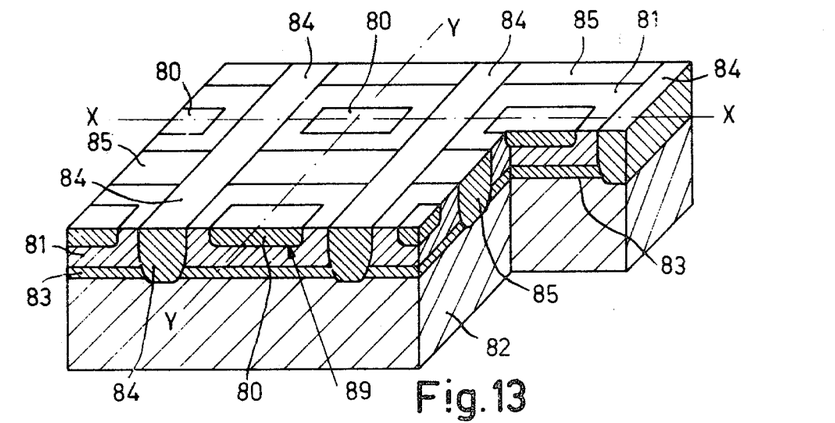
FIG. 13 is a perspective view of part of a device embodying the invention formed by an X-Y matrix.

The device shown partly in FIG. 13 is a mosaic of electro-luminescent diodes of the X-Y type. The diodes arranged in two orthogonal directions (XX and YY in FIG. 13) have a pn-junction which is formed by the local diffusion of zones 80 in an epitaxial layer 81 of the opposite conductivity type grown on an intermediate layer 83 of the same type as the layer 81 but highly doped and grown epitaxially on an electrically insulating substrate 82. The layer 83 is impermeable to the radiation emitted by the junctions 89 when biased in the pass direction. The layer 81 is permeable to said radiation. The substrate 82, which is screened by the impermeable layer 83, preserves its electrically insulating property even if this substrate consists of a material which may be ionized by the radiation. Zones 84 isolate the diodes of the same row YY from the diodes of an adjacent row. These zones 84 are diffused down to the substrate and are of a conductivity type opposite that of the layers 81 and 83 so that their pn-junction can be cut off by biasing in the reverse direction. These zones 84 are doped to a concentration such that they have a high absorption coefficient for the radiation emitted by the junction 89.

The diodes of the same row YY are isolated from each other by highly doped diffused zones of the same conductivity type as the layers 81 and 83; the zones 85 absorb the radiation emitted by the diodes.

The connections not illustrated in FIGS. 12 and 13 are established by means of the so-called multilayer technique employed in the manufacture of integrated circuits. In this technique, isolating layers are deposited at various consecutive levels at the desired areas in accordance with the desired structure, the layers being of a conductive metal, so that the reverse voltage can be applied to the isolating zones 84 and the excitation voltages may be applied, for example, to the row of zones 81 and to the column of zones 82, which correspond to the diode to be excited (FIG. 13).

An X-Y matrix of the kind shown in FIG. 13 is made on a substrate of semiconductor gallium arsenide doped with chromium and having a resistivity of more than $10^{16}$ Ohm.cm at room temperature.

A first epitaxial layer of gallium arsenide phosphide of the formula $GaAs_{1-x}P_x$, wherein x lies between 0 and 1, doped with $2\times10^{18}$ tellurium at/cm$^3$ and having a thickness lying between 5 and 20 μm is grown on the substrate and a second epitaxial layer of the same composition or having a higher phosphide concentration doped with $10^{17}$ tellurium atoms/cc and having a thickness of about 20μ is grown on the former. The regions forming electro-luminescent junctions are doped with zinc to a concentration of the order of $10^{18}$ at/cm$^3$ and the impermeable zones restricting the emission of a junction are doped with zinc to a concentration of the order of $10^{19}$ at/cm$^3$ in the zones 84 and with tin to a concentration of $10^{19}$ at/cm$^3$ in the zones 85.

It will be obvious that a so-called "dot mosaic" for the display of symbols comprising, for example, seven columns of five dots or any other combination thereof, may be manufactured in accordance with the invention in the same structure as the matrix shown in FIG. 6.

The invention can be carried out with the aid of any electro-luminescent material, particularly materials having an indirect band structure and being permeable to their own radiation, if they are not highly doped; a preferred material is gallium phosphide doped with tellurium during the epitaxial growth from a gallium solution or from the vapour phase or doped with zinc by localized diffusion.

The invention permits of manufacturing any integrated mosaic in monolithic form, particularly matrices for the display of symbols and matrices of the X-Y type.

What is claimed is:

1. A monolithic semiconductor device comprising a semi-insulating substrate having resistivity reduced by absorption of emitted radiation, a layer of monocrystalline semiconductor material on said substrate, at least two electroluminescent elements formed separately at least partially in said layer, said electro-luminescent elements formed of two regions of different conductivity type having a pn junction between said regions, electrode means for establishing emissive radiation from said pn junctions, optical separating zones adjacent said electroluminescent elements and extending across the entire thickness of said layer to prevent emissive radiation from passing laterally in said layer, said optical separating zones having a width at least equal to three times the diffusion length of free charge carriers in said substrate.

2. A semiconductor device as defined in claim 1, wherein at least one of said optical separating zones includes an electrical isolation element.

3. A semiconductor device as defined in claim 1, further comprising a region disposed between at least one of said electro-luminescent elements and said substrate, said optical separating zone extending down to at least said region.

4. A semiconductor device as defined in claim 1, wherein said optical separating zones include a layer disposed between each one of said electro-luminescent elements and said substrate.

5. A semiconductor device as defined in claim 1, further comprising a second layer of monocrystalline semiconductor material disposed on said semiconductor layer, said second layer being of opposite conductivity type to said semiconductor layer, and said semiconductor layer comprising all of the first ones of said conductivity regions of said electro-luminescent elements and said second semiconductor layer comprising all of the second ones of said regions.

6. A semiconductor device as defined in claim 1, wherein said substrate consists of material highly absorbent to said emitted radiation, whereby said substrate can strongly absorb said emitted radiation.

7. A semiconductor device as defined in claim 1, wherein a portion of said optical separation zones extend into said substrate and has a minimum width of at least six times the absorption length of said emitted radiation in said substrate.

8. A semiconductor device as defined in claim 1, wherein said electro-luminescent elements are separated by grooves individually containing an electrically insulating layer disposed at the respective walls of said grooves.

9. A semiconductor device as defined in claim 1, wherein said semiconductor layer consists of an epitaxial layer containing both conductivity regions of said electro-luminescent elements and said optical separating zones consist of highly doped diffused zones of conductivity type opposite that of said epitaxial layer.

10. A semiconductor device as defined in claim 1, wherein at least two spaced-apart optical separating zones are disposed between adjacent ones of said electro-luminescent elements.

11. A semiconductor device as defined in claim 1, wherein said electro-luminescent elements are arranged in rows and columns individually containing a plurality of said electro-luminescent elements, certain ones of said electro-luminescent elements disposed in one of said rows and columns being optically isolated and electrically insulated from each other by said optical separating zones being of electrically insulating material and other ones of said electro-luminescent elements disposed in the other one of said rows and columns being optically isolated from and electrically connected to each other by said optical separating zones being of low electrical resistivity.

12. A semiconductor device as defined in claim 1, wherein said optical separating zones consist essentially of a material having a forbidden band width below the photon energy of said emitted radiation.

13. A semiconductor device as recited in claim 1, wherein second ones of said regions are diffused into said semiconductor layer and have a conductivity type opposite that of said layer.

14. A semiconductor device as defined in claim 1, comprising means for electrically isolating said electro-luminescent elements from each other.

15. A semiconductor device as defined in claim 14, wherein said means comprise a rectifying junction defined by one of said regions and said semiconductor layer.

16. A semiconductor device as defined in claim 15, comprising means for reverse biasing said rectifying junction.

17. A semiconductor device as defined in claim 1, wherein said optical separating zones comprise diffused doping impurity material.

18. A semiconductor device as defined in claim 1, wherein said substrate consists essentially of semiconductor material highly doped to one conductivity type.

19. A semiconductor device as defined in claim 18, wherein said substrate and said semiconductor layer consist essentially of the same semiconductor material.

20. A semiconductor device as defined in claim 19, wherein said semiconductor material is gallium phosphide.

21. A semiconductor device as claimed in claim 1, wherein said optically separating zones comprise a material having a smaller band gap than the material of said monocrystalline layer.

22. A semiconductor device as claimed in claim 1, wherein said substrate comprises gallium arsenide.

* * * * *